United States Patent [19]
Losee

[11] Patent Number: 5,891,752
[45] Date of Patent: Apr. 6, 1999

[54] METHOD FOR MAKING CHARGE COUPLED DEVICE WITH ALL ELECTRODES OF TRANSPARENT CONDUCTOR

[75] Inventor: David L. Losee, Fairport, N.Y.

[73] Assignee: Eastman Kodak Company, Rochester, N.Y.

[21] Appl. No.: 842,456

[22] Filed: Apr. 24, 1997

[51] Int. Cl.⁶ .................................................. H01L 21/00
[52] U.S. Cl. ................................................................ 438/75
[58] Field of Search ................................. 438/75, 76, 77, 438/78, 79, 80, 56

[56] References Cited

U.S. PATENT DOCUMENTS

| | | |
|---|---|---|
| 4,807,004 | 2/1989 | Wan et al. . |
| 5,114,872 | 5/1992 | Roselle et al. . |
| 5,230,771 | 7/1993 | Roselle . |
| 5,292,682 | 3/1994 | Stevens et al. . |
| 5,460,997 | 10/1995 | Hawkins et al. . |
| 5,516,716 | 5/1996 | Hawkins et al. . |

OTHER PUBLICATIONS

S.L. Kosman et al., "A Large Area 1.3 Metgapixel Full–FrameCCD Image Sensor With A Lateral–Overflow Drain And A Transparent Gate Electrode", 1990 IEEE, pp. 287–290.

W.F. Keenan and D.C. Harrison, "A Tin Oxide Trnasparent–Gate Buried–Channel Virtual–Phase CCD Imager", 1985 IEEE, pp. 1531–1533.

*Primary Examiner*—Charles Bowers
*Assistant Examiner*—Craig Thompson
*Attorney, Agent, or Firm*—James D. Leimbach

[57] ABSTRACT

A method and apparatus of manufacturing an array of closely spaced electrodes wherein a semiconductor surface having a plurality cells that are capable of storing charge is fabricated such that there are a plurality of closely spaced electrodes associated with the cells and placing insulation regions between the closely spaced electrodes. The insulating regions are preferably made out of silicon dioxide and the material to form the electrodes is selected as one that is not oxidizable to silicon dioxide. The preferred embodiment uses an electrode material indium tin oxide. A barrier region is provided to assist charge transfer in the preferred embodiment the barrier region is preferably edge aligned to one of the electrodes.

13 Claims, 6 Drawing Sheets

5,891,752

METHOD FOR MAKING CHARGE COUPLED DEVICE WITH ALL ELECTRODES OF TRANSPARENT CONDUCTOR

FIELD OF THE INVENTION

The present invention relates to charge coupled devices having transparent electrodes and more specifically to the insulation between electrodes within devices having all transparent electrodes.

BACKGROUND OF THE INVENTION

Charge coupled devices, hereinafter referred to as CCDs, are used as image sensors and shift registers and are typically comprised of sets of closely spaced electrodes, or gates, which usually are composed of doped polycrystalline silicon. Typically, close spacing between adjacent gates is necessary to assure satisfactory charge transfer efficiency. In order to achieve the small dimensions required for this spacing, a process is conventionally employed whereby a first set of electrodes is deposited and patterned. This first set of electrodes is then subjected to an oxidizing process where a thin oxide is formed to completely envelop the first set of electrodes. Then a second set of electrodes is deposited and patterned with the edges of the second set of electrodes overlapping the edges of the first set so as to form a closely spaced array of electrodes. The oxide which had been grown of the first level electrode serves then to insulate adjacent electrodes from one another while maintaining the desired close spacing. The material of choice for gate electrodes is generally chosen to be polycrystalline silicon because of its ability to be oxidized with a high integrity insulating oxide, whereas, the other conductive materials, such as indium tin oxide (ITO), which cannot be readily oxidized to form an insulating coating, are not suitable.

Devices with polycrystalline silicon electrode structures, as described above, are commonly employed in image sensing devices where light must first penetrate these electrodes, then be absorbed in the silicon substrate to form electron/hole pairs wherein the photogenerated electrons are collected and detected by appropriate circuitry. The sensitivity of such devices is, however, diminished by the overlaying polysilicon which absorbs some of the incident light before it reaches the silicon substrate. Devices have been proposed where the second electrode layer is replaced by a more transparent material such as indiumtin-oxide (ITO). See, for example, Kosman et al. IEEE International Electronic Devices Meeting, 1990. Technical Digest, p 287–290. This improves the device sensitivity but some light is still absorbed by the first layer electrode which is still composed of polysilicon and covers approximately 50% of imaging area. A so-called, virtual phase CCD with a single transparent electrode has been reported by Keenan et al. (IEE Trans. on Electron Devices ED-32, 1531, (1985)) which avoids this light absorption but that device is limited in its charge handling capacity due to the requirements of the virtual phase segments of the CCD register and, also by increased processing complexity.

In a multiphase CCD sensor, if the first level electrode as well as the second level electrode were composed of ITO, the sensitivity of the device could be improved while retaining the charge handling capabilities of a multielectrode CCD structure. However, most transparent conductive materials, such as ITO, are not amenable to oxidation for the formation of a high integrity insulator needed to insulate the first level electrode from the second level electrode. For satisfactory device operation it is necessary to insure against electrical leakage or short circuits between the closely spaced electrodes. A method for fabrication of a CCD device with a single layer of ITO with narrow etched spaces between electrodes has been proposed by Kosman et al. U.S. Pat. No. 5,114,872. This method is complex, involving deposition of at least three additional layers over the ITO layer and also depends critically on etch selectivities and anisotropy.

Wan et al., in U.S. Pat. No. 4,807,004, proposed a CCD device wherein a single ITO layer is deposited as a semi-insulative layer and then rendered conductive in selective areas by ion implantation. These electrodes are defined by narrow unimplanted regions in the ITO layer. The spacing between adjacent gate electrodes in such a device is limited by the resolution of the photomasking process used to define the unimplanted regions and by the leakage current which can be tolerated between the CCD clock phases via the unimplanted ITO regions. Obviously, the leakage currents will be dependent on the width of the unimplanted regions, with narrower electrode spacings, which are usually desired for good charge transfer efficiency, having higher leakage currents.

From the foregoing discussion, it should be apparent that there remains a need in the art for a method and apparatus employing transparent electrodes, whereby, sufficient insulation is achieved between electrodes without resulting oxidation in the electrodes. There is also a need for a simplification of the processes required to produce such electrodes.

SUMMARY OF THE INVENTION

The present invention disclosure provides a means for producing close spaced, reliably insulated, electrodes, which may be composed of materials which do not readily oxidize with high quality insulating oxide coatings. These electrodes may, for example, be composed of transparent conducting films such as ITO. The disclosure permits construction of a device with improved sensitivity to light. In the following description the use of the term ITO should be construed to generically include other transparent conductive materials. A further advantage of the invention is that it provides a device where the gate electrodes do not overlap, thus reducing capacitance between electrodes as well as providing a highly planar device. A highly planar structure is an advantage for deposition and patterning of overlayers such as light shielding layers or color filter arrays.

The above is provided by the present invention for manufacturing a charge coupled device having an array of closely spaced electrodes wherein firstly provided is a semiconductor surface having a plurality of image sensing elements fabricated within the semiconductor and a plurality of closely spaced free standing, thin, insulative stubs formed on the image sensing elements such that there are at least two stubs for each of the image sensing elements; and secondly provided are electrodes between the stubs, each of the electrodes being formed from a single layer of a transparent conductive material.

Advantageous Effect of the Invention

The present invention permits construction of a device with improved sensitivity to light, achieving nearly 100% optical fill factor without the need for additional complex structure such as overlaying microlens arrays. A further advantage of the invention is that it provides a device where the gate electrodes do not overlap, thus reducing capacitance between electrodes as well as providing a highly planar device. A highly planar structure is an advantage for deposition and patterning of overlayers such as light shielding layers or color filter arrays.

DETAILED DESCRIPTION OF THE INVENTION

Figure 1A:
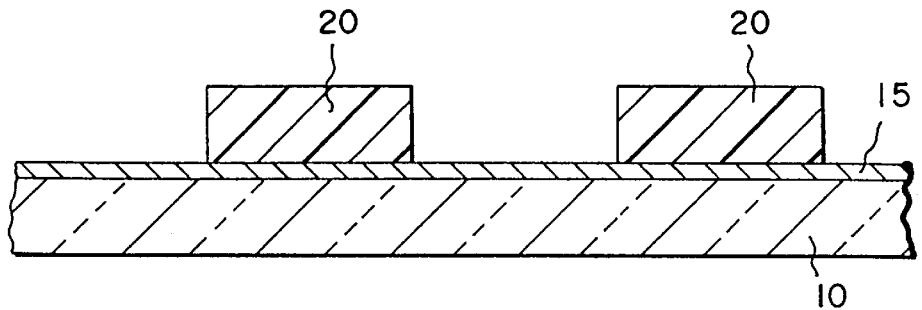
FIGS. 1A–1G illustrate the steps required to fabricate the first embodiment of the invention.

Referring to FIGS. 1A through 1F, a first preferred embodiment of the invention is illustrated as envisioned by the present invention. FIGS. 1A shows a schematic cross-sectional diagram of a part of a silicon wafer where a silicon substrate 10 is provided with a dielectric coating 15, which is typically silicon dioxide, but may also be a composite layer containing other dielectrics such as, silicon nitride. It is understood that the silicon substrate may also include doped regions and regions with other dielectric layers. In addition, polycrystalline silicon is applied to the silicon substrate, hereinafter referred to as polysilicon, patterns 20 which are provided on the coating 15. The patterned polysilicon features 20 are shaped and placed corresponding to the electrode pattern desired for a first set of ITO electrodes in the device.

Figure 1B:
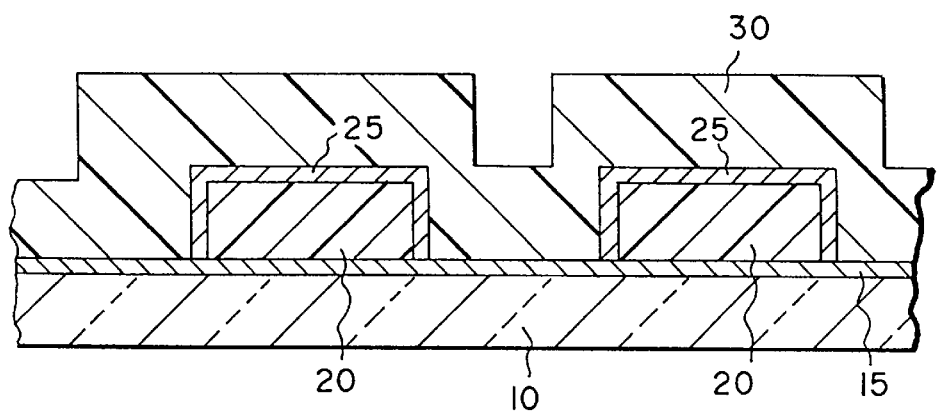

Referring now to FIG. 1B, an oxide coating 25 is grown on the patterned polysilicon 20. The entire surface is then covered by a second layer of polysilicon 30 which is deposited using any conventional process.

Figure 1C:
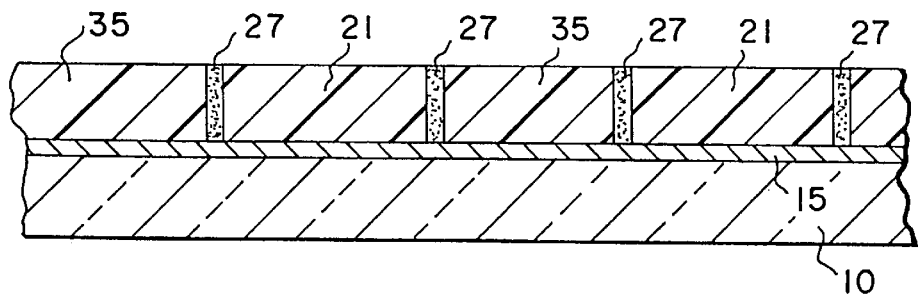

FIG. 1C is an illustration of FIG. 1B wherein portions of polysilicon layer 30 and oxide coating 25 are subjected to chemical-mechanical polishing (CMP) to remove the topmost portions of polysilicon layer 30 and coating 25, but leaving portions of polysilicon 35 from polysilicon layer 30, sidewall strips of oxide 27 of coating 25, as well as portions polysilicon 21 from the original polysilicon 20.

Figure 1D:
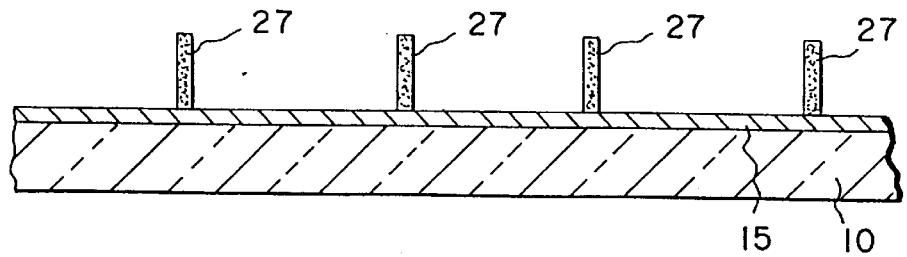

The now exposed polysilicon 21 and 35, are exposed to an etchant which does not attack the silicon dioxide sidewall strips 27 or the underlying dielectric 15, resulting in the structure shown in FIG. 1D where the sidewall oxide strips 27, or stubs, remain standing on the wafer surface.

Figure 1E:
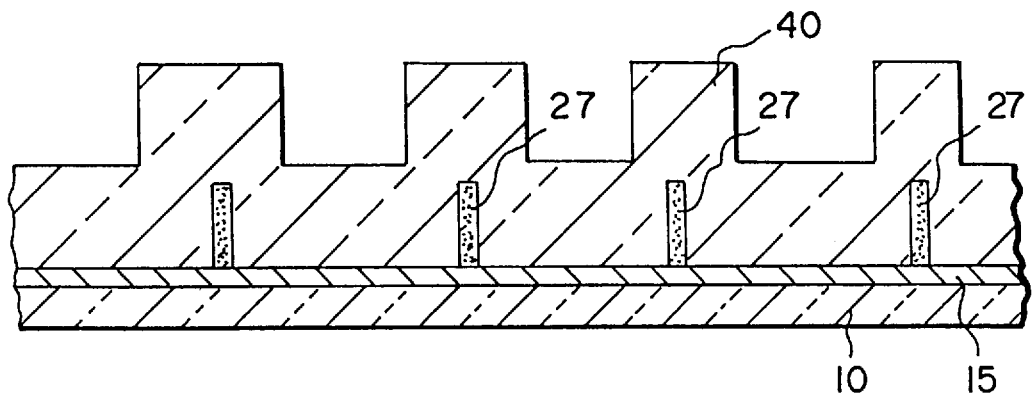

The structure is next coated with the desired transparent conductive layer 40, which may be ITO, as shown in FIG. 1E.

Figure 1F:
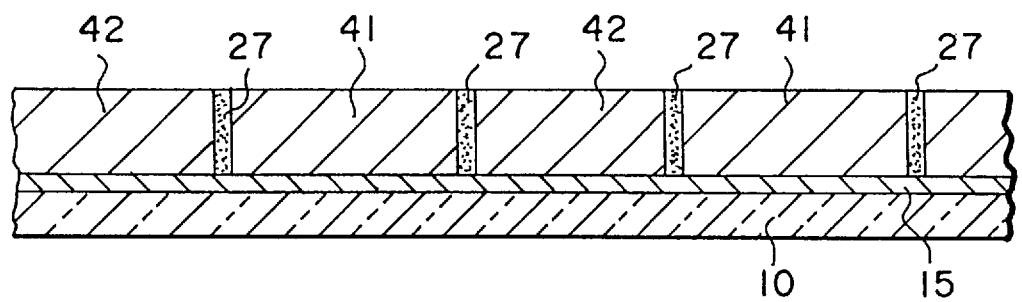
Figure 1G:
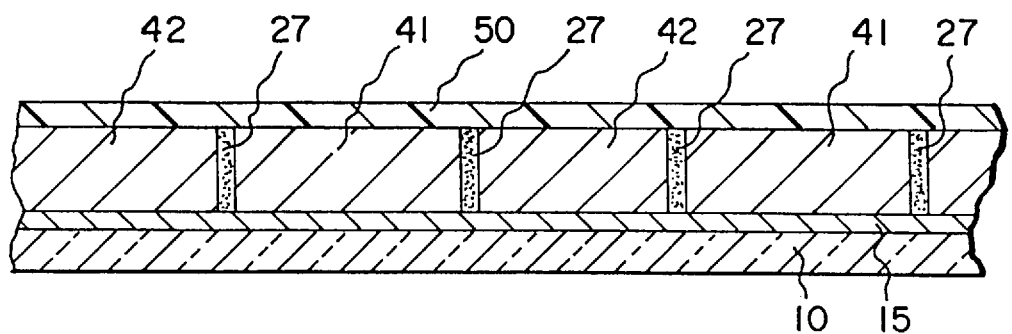

The device is again subjected to CMP to remove the uppermost portions of layer 40, leaving adjacent, and electrically separate electrodes 41 and 42, as shown in FIG. 1F. A top insulator 50 is then deposited over the structure as is also indicated in FIG. 1G. This structure, which now consists of an array of electrically separate but close spaced transparent conductors, is suitable for use as a charge coupled device shift register. The device is then completed in a manner similar to, and well understood by those skilled in the art of producing CCD devices.

Figure 2A:
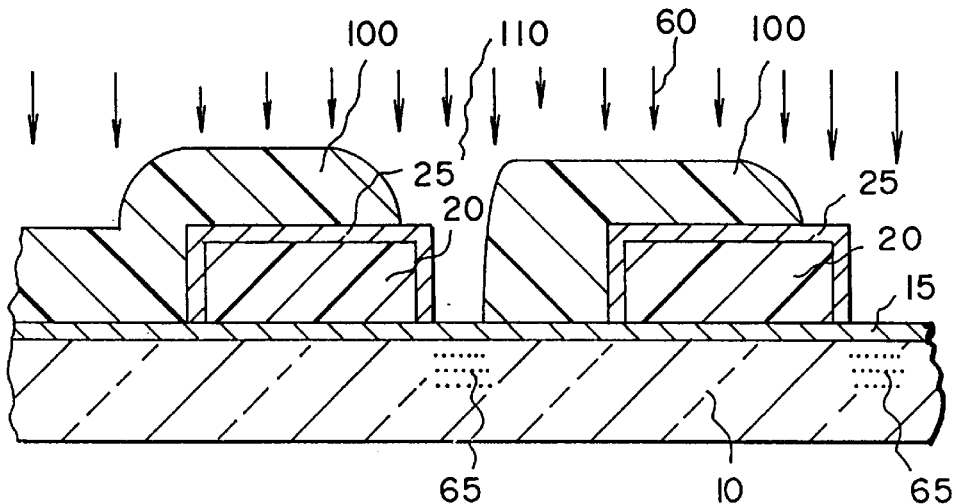
FIGS. 2A–2I illustrate the steps required to fabricate the second embodiment of the invention.
Figure 2B:
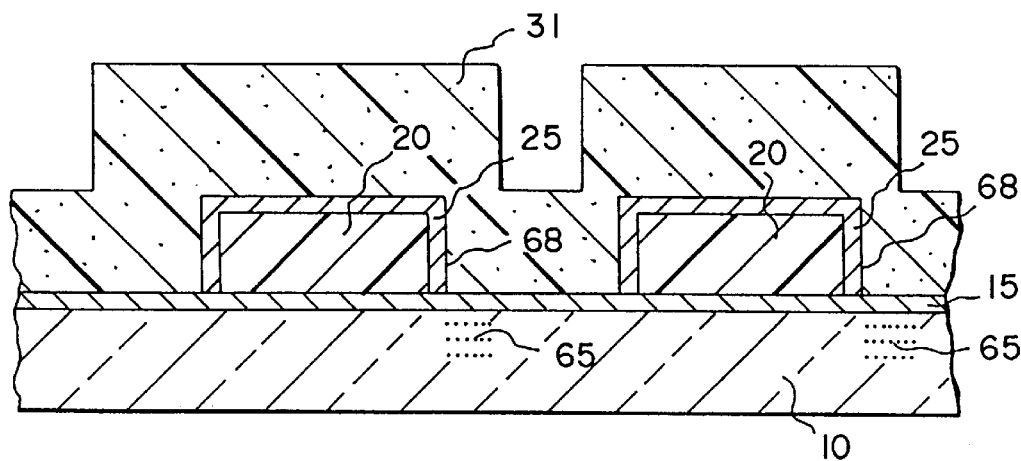

Referring now to FIG. 2A, a second preferred embodiment of the present invention is illustrated wherein the structure as depicted in FIG. 1A is subjected to oxidation to produce insulating oxide coating 25 over the original patterned polysilicon 20. A photoresist pattern 100 is then formed such that there exist openings 110 in the photoresist pattern which overlap at least one edge of the features of the patterned polysilicon 20. The wafer is then implanted with dopant atoms, as indicated by arrows 60, having energy sufficient to penetrate the dielectric layer 15 but insufficient to penetrate the photoresist pattern 100 or the features of the patterned polysilicon 20 that have oxide coating 25. The photoresist pattern 100 is then removed thus leaving doped regions 65 which are edge aligned to sidewalls 68 of the oxide coating 25 which cover the polysilicon features 20. In a manner similar to that described in the first embodiment, a second polysilicon layer 31 is deposited over the wafer, resulting in that diagram as seen in FIG. 2B.

Figure 2C:
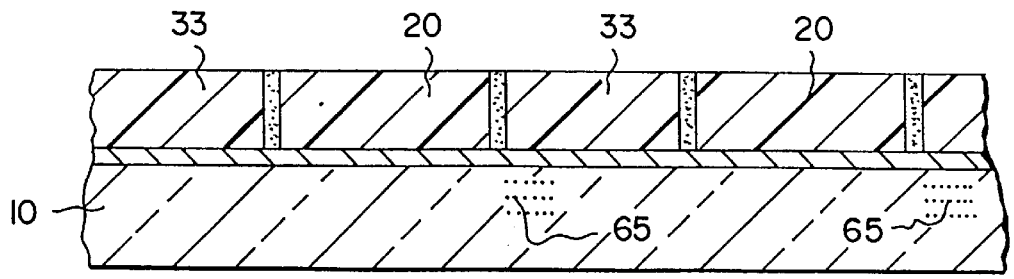

Referring now to FIG. 2C, the uppermost portions of polysilicon layer 31 and the upper portions of oxide layer 25, are removed by CMP. This results in the structure diagrammed in FIG. 2C, with regions of polysilicon 33 interspersed among polysilicon features 20, the interspersed polysilicon regions 33 being characterized by the presence of doped regions 65 situated beneath them and edge aligned to them.

Figure 2D:
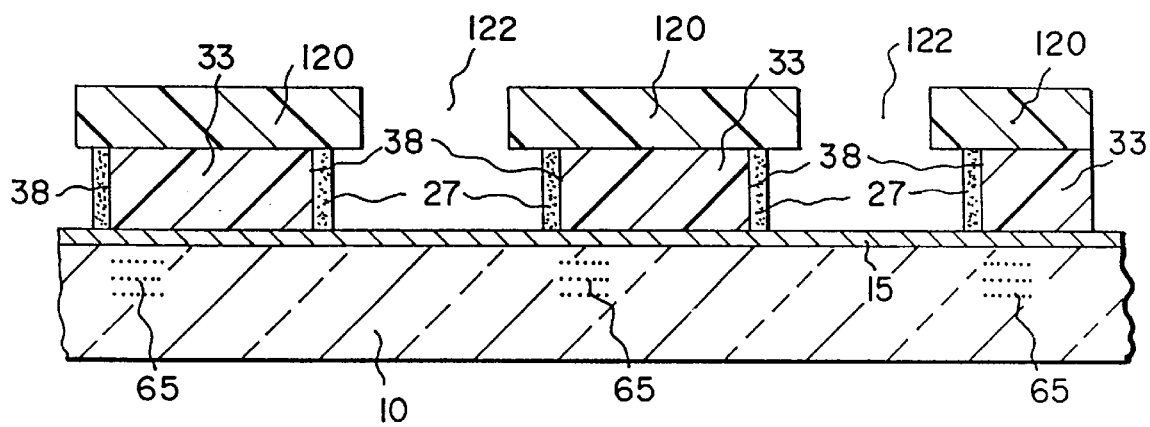
Figure 2E:
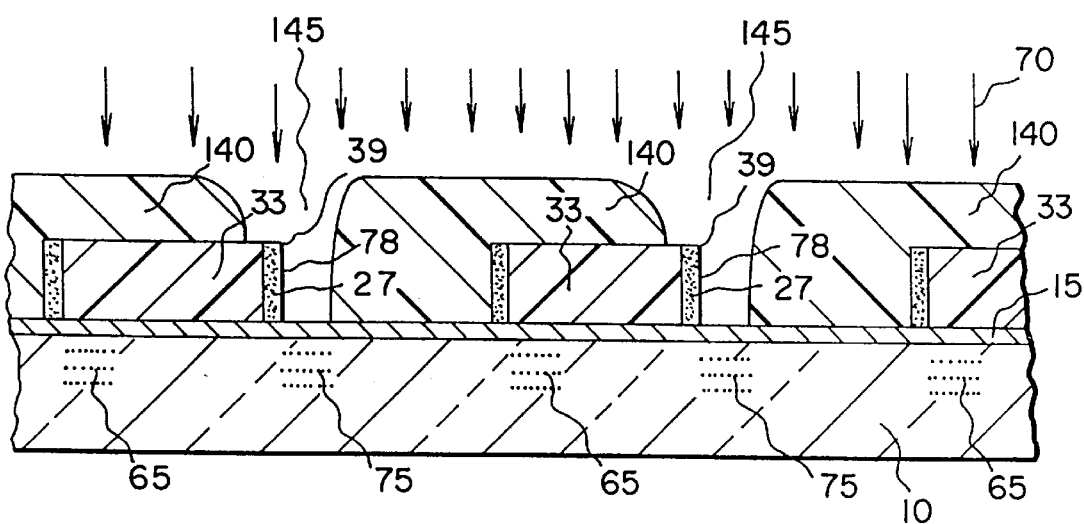
Figure 2F:
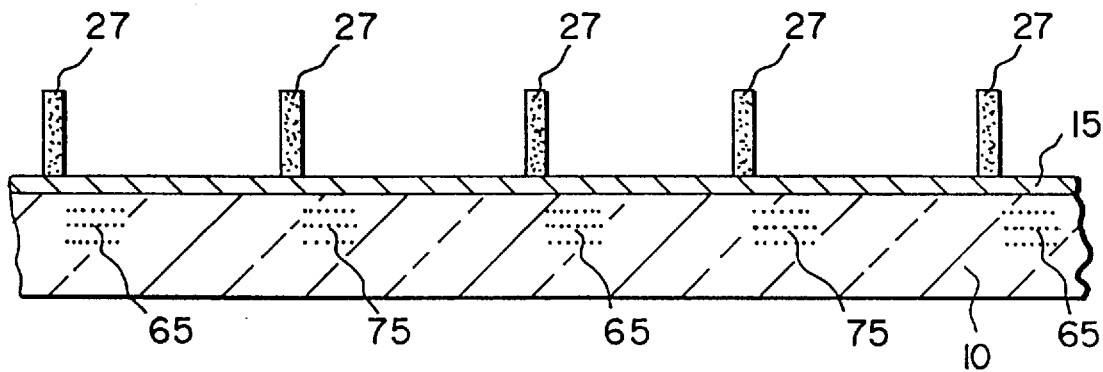
Figure 2G:
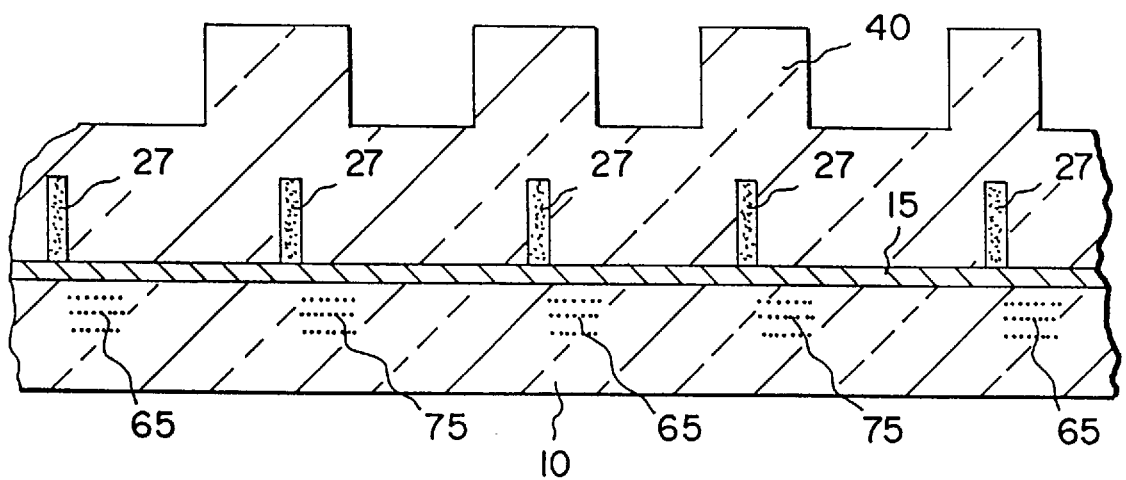
Figure 2H:
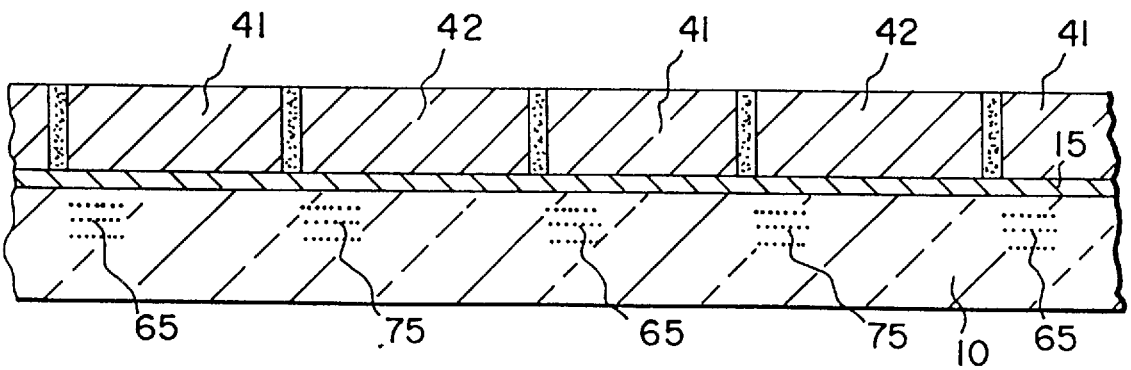
Figure 2I:
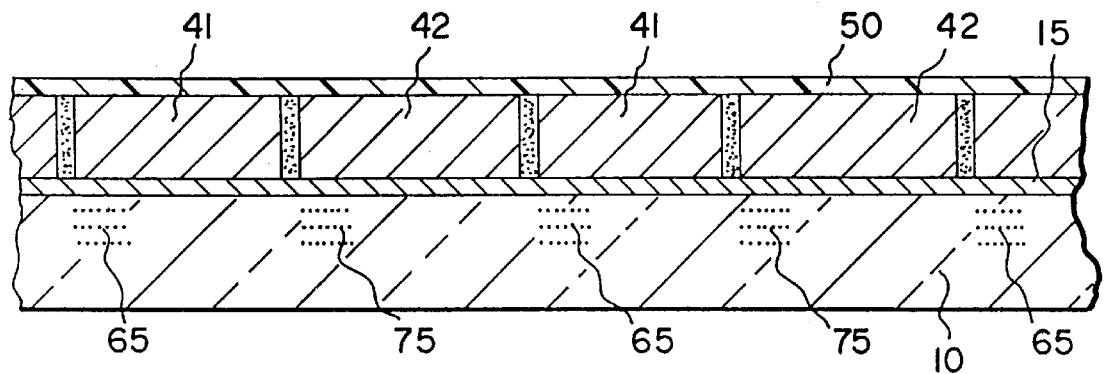
Figure 3:
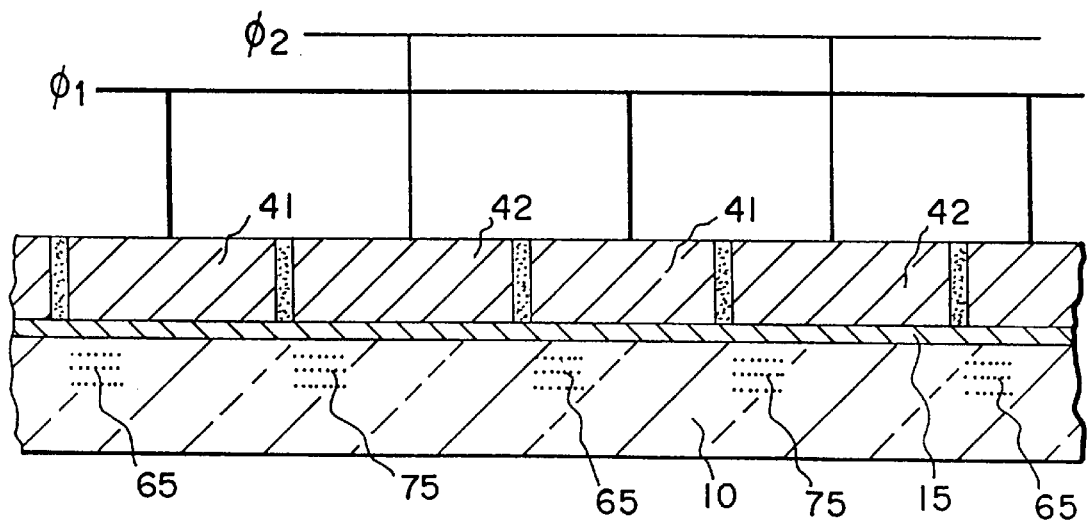
FIGS. 3 illustrates a charge coupled device built in accordance with the present invention.

As shown in FIG. 2D, a patterned photoresist 120 is applied having openings 122 that overlap the edges 38 of the polysilicon feature 33. The polysilicon material 20 exposed by the resist openings 122 is then etched with an etchant which does not significantly attack silicon dioxide but which will etch polysilicon in an isotropic manner, to thus remove all polysilicon from the regions 122 and up to the oxide walls 27. Referring now to FIG. 2E, the photoresist is then removed by conventional means such as by exposure to an oxygen plasma. A next coating of photoresist 140 is applied and patterned with openings 145. Openings 145 are positioned so as to expose edges 39 of oxide sidewalls 27 of the polysilicon features 20. Dopant atoms as indicated by arrows 70, having energy sufficient to penetrate the dielectric layer 15 but insufficient to penetrate the photoresist pattern 120 or the features 33 with their oxide coating 25. The photoresist is then removed, thus leaving doped regions 75 which are edge aligned to sidewalls 78 of the oxide sidewalls 27 which cover the edges of the polysilicon features 33. The now exposed polysilicon materials, 33 are exposed to an etchant which does not attack the silicon dioxide sidewall strips 27 or the underlying dielectric 15, resulting in the structure shown in FIG. 2F where the sidewall oxide strips 27 remain standing on the wafer surface. The structure is next coated with the desired transparent conductive layer 40, which may be ITO, as shown in FIG. 2G. The device is again subjected to CMP to remove the uppermost portions of layer 40, leaving adjacent, and electrically separate electrodes 41 and 42, as shown in FIG. 2H A top insulator 50 is then deposited over the structure as is also indicated in FIG. 2I. This structure, which now consists of an array of electrically separate but close spaced transparent conductors with edge aligned implanted regions such as are suitable for use as a two-phase charge coupled device shift register. The device is then completed in a manner similar to, and well understood by those skilled in the art of producing CCD devices. This is illustrated schematically in FIG. 3 where the structure of FIG. 2I is provided with clocking voltages F1 and F2 as indicated to produce a two-phase CCD shift register.

It should be clear to those skilled in the art, that the implanted regions 65 and 75 could be formed with either n-type or p-type dopant atoms, thus producing either barrier regions or storage regions beneath the gate electrodes.

In either of the embodiments of the present invention previously discussed, the characteristic feature of the structure is that a silicon dioxide structure is produced which, in cross-section appears stub-like and which in perspective view would appear fence-like. This structure is then surrounded with a coating of ITO. The uppermost portion of this ITO coating is then removed by polishing so as to expose the topmost portion of the insulating "fence" and thus to provide electrical separation of the various sections of the remaining ITO.

The foregoing description as detailed is the most preferred manner of practicing the present invention. However, it will be clear to those skilled in the art that numerous, obvious variations of the invention are achievable, therefore, the scope of the invention should be measured by the appended claims.

PARTS LIST

| | |
|---|---|
| 1 | |
| 10 | substrate |
| 15 | coating |
| 20 | polysilicon |
| 21 | polysilicon |
| 25 | coating |
| 27 | oxide |
| 30 | polysilicon |
| 33 | polysilicon |
| 35 | polysilicon |
| 38 | edges |
| 39 | edges |
| 40 | transparent conductive layer |
| 41 | electrode |
| 42 | electrode |
| 50 | insulator |
| 60 | dopant implant |
| 65 | dopant regions |
| 68 | sidewalls |
| 70 | dopant atoms |
| 75 | dopant regions |
| 78 | sidewall |
| 100 | photoresist |
| 110 | opening in photoresist |
| 120 | photoresist |
| 122 | opening in photoresist |
| 140 | photoresist |
| 145 | openings |

What is claimed is:

1. A method of manufacturing a charge coupled device having an array of closely spaced electrodes comprising the steps of:
    firstly providing a semiconductor surface having a plurality of image sensing elements fabricated within the semiconductor and a plurality of closely spaced free standing, thin, insulative stubs formed on the image sensing elements such that there are at least two stubs for each of the image sensing elements; and
    secondly providing electrodes between the stubs, each of the electrodes being formed from a single layer of a transparent conductive material.

2. The method of claim 1 wherein the step of firstly providing further comprises providing stubs comprised of silicon dioxide.

3. The method of claim 1 wherein the step of secondly providing further comprises providing the electrodes from indium tin oxide.

4. The method of claim 1 wherein the step of secondly providing further comprises providing at least implanted region that is edge aligned to one of the electrodes.

5. The method of claim 1 wherein the step of secondly providing further comprises providing the barrier region implanted such that it is edge aligned to one of the electrodes.

6. The method of claim 1 wherein the step of secondly providing further comprises providing electrodes that have been polished.

7. The method of claim 1 further comprising the step of forming at least one charge storage region prior following the secondly providing step.

8. A method of manufacturing a charge coupled device having an array of closely spaced electrodes comprising the steps of:
    providing a semiconductor with a surface having a plurality of image sensing elements fabricated within the semiconductor;
    placing a dielectric coating over at least the image sensing elements;
    patterning a series of polysilicon features upon the dielectric;
    growing an oxide coating upon the polysilicon features;
    covering the oxide coating with a polysilicon layer;
    removing the polysilicon layer and the top portion of the oxide coating;
    etching remaining polysilicon with an etchant that does not attack the oxide coating portions that have not been removed to form a plurality of oxide stubs;
    forming transparent electrodes between the oxide stubs; and
    placing an insulator over the electrodes.

9. The method of claim 8 further comprising the step of implanting at least one barrier region following the growing an oxide step.

10. The method of claim 8 wherein the step of implanting further comprises implanting at least one barrier region to be edge aligned to an electrode.

11. The method of claim 10 wherein the step of implanting further comprises the steps of:
    forming a photoresist pattern having openings in areas over electrode edges through which barrier implants are to be formed;
    implanting barrier regions with a dopant having sufficient energy to dielectric layer but insufficient energy to penetrate the photoresist; and
    removing the photoresist.

12. The method of claim 11 further comprising the steps recited by claim 8 to be performed after the etching step.

13. The method of claim 8 further comprising the step of forming at least one charge storage region following the growing an oxide step.

* * * * *

UNITED STATES PATENT AND TRADEMARK OFFICE
CERTIFICATE OF CORRECTION

PATENT NO. : 5,891,752
DATED : April 6, 1999
INVENTOR(S) : David L. Losee

It is certified that error appears in the above-identified patent and that said Letters Patent is hereby corrected as shown below:

Column 6, Line 50    between "energy to" and "dielectric layer", insert -- penetrate the --.

Signed and Sealed this

Twenty-first Day of September, 1999

*Attest:*

Q. TODD DICKINSON

*Attesting Officer*    *Acting Commissioner of Patents and Trademarks*